United States Patent
Annadurai et al.

(10) Patent No.: US 6,968,492 B1
(45) Date of Patent: Nov. 22, 2005

(54) HARDWARE-EFFICIENT CRC GENERATOR FOR HIGH SPEED COMMUNICATION NETWORKS

(76) Inventors: Andy P. Annadurai, 5112 Amberwood Dr., Fremont, CA (US) 94555; Chris Tsu, 13625 Surrey La., Saratoga, CA (US) 95070; Feng Han, 1541 Poppybank Ct., Pleasanton, CA (US) 94566; Hon-Ming Li, 38401 Crosspointe Common, Fremont, CA (US) 94536

( * ) Notice: Subject to any disclaimer, the term of this patent is extended or adjusted under 35 U.S.C. 154(b) by 297 days.

(21) Appl. No.: 10/113,469

(22) Filed: Mar. 28, 2002

(51) Int. Cl.$^7$ .............................................. H03M 13/00
(52) U.S. Cl. .......................... 714/776; 714/758; 714/781
(58) Field of Search ........................ 708/650; 714/781, 714/798, 761, 758, 811, 757, 776

(56) References Cited

U.S. PATENT DOCUMENTS

| | | | | |
|---|---|---|---|---|
| 5,367,479 A | * | 11/1994 | Van Der Putten | 708/650 |
| 5,402,429 A | * | 3/1995 | Stessens | 714/781 |
| 5,832,002 A | * | 11/1998 | Endresen et al. | 714/798 |
| 5,943,348 A | * | 8/1999 | Ly | 714/761 |
| 6,530,057 B1 | * | 3/2003 | Kimmitt | 714/758 |
| 6,665,834 B2 | * | 12/2003 | Irvin et al. | 714/811 |
| 6,701,478 B1 | * | 3/2004 | Yang et al. | 714/757 |
| 6,701,479 B2 | * | 3/2004 | Keller | 714/757 |

* cited by examiner

*Primary Examiner*—David Ton

(57) ABSTRACT

A cyclic redundancy check (CRC) generator, in accordance with a specific embodiment of the present invention, generates a 32-bit CRC for each packet whose data bytes are carried over a 128-bit bus by first dividing the data bytes by a $123^{nd}$ degree generator polynomial and subsequently dividing the remainder of the first division by a $32^{nd}$ degree generator polynomial. Data bytes of a new packet are divided by a different dividing logic than those of a current packet. The remainder of division performed on the bytes of a new packet are supplied to the dividing logic adapted to divide the bytes of a current packet. The division by the $123^{nd}$ degree generator polynomial is performed on a per byte basis, with the remainder of the division of the $(i+1)^{th}$ byte being used in the division of the $i^{th}$ byte.

25 Claims, 5 Drawing Sheets

HARDWARE-EFFICIENT CRC GENERATOR FOR HIGH SPEED COMMUNICATION NETWORKS

BACKGROUND OF THE INVENTION

The present invention relates to detection of errors introduced in data while being transmitted over a communications networks, and more particularly to an efficient implementation of a cyclic redundancy check (CRC) generator for high speed communication networks such as SONET.

Demand for high performance communication networks capable of transporting multiple types of data, such as text, audio and video data, is on the rise. To carry greater amount of data over existing communication channels, such as fiber-optic communication channels, network carriers are increasingly using high bandwidth technologies, such as wave division multiplexing (WDM) and optical carrier (OC) level 48. Such communication networks rely upon high-performance packet switches, such as asynchronous transfer mode (ATM) switches, frame relay switches and internet protocol (IP) routers which route the incoming packets to their desired destinations.

Inherent in most digital communication channels are errors introduced when transferring frames, packets or cells containing data. Such errors are often caused by electrical interference or thermal noise. Data transmission error rates depend, in part, on the medium which carries the data. Typical bit error rates for copper based data transmission systems are in the order of $10^{-6}$. Optical fibers have typical bit error rates of $10^{-9}$ or less. Wireless transmission systems, on the other hand, may have error rates of $10^{-3}$ or higher. To maintain data integrity during transmission, most communication systems deploy an error-control mechanism.

A known technique for error control, commonly referred to as error detection, involves detection of errors by the receiver followed by a retransmission of the data by the transmitter. In accordance with this error detection technique, a code is computed from the data at the transmitting end using a predefined algorithm. The data and the code—which is appended to the data—are subsequently transmitted to the receiver. The receiver, using the same predefined algorithm, computes another code from the transmitted data. If the code computed by the receiver matches the code computed by the transmitter, the data is considered to be free of errors.

Many of the conventional algorithms use polynomial codes to generate error-detecting codes. An error-detecting code generated using a polynomial code is commonly referred to as a cyclic redundancy check (CRC). A polynomial code is typically specified by its generator polynomial g(x) which is used by both the transmitter and the receiver to compute their respective CRCs. A CRC is the remainder of the division of data by a generator polynomial. The number of bits in the remainder is the same as the degree of the generator polynomial. If the CRC computed from the data by the transmitter does not match the CRC computed from the data received by the receiver, the data is flagged as corrupt, thus forcing the transmitter to retransmit the data.

There are several well-known generator polynomials. For example, generator polynomial $g(x)=x^8+x^2+x+1$ is used to generate CRC-8 (i.e., an 8-bit CRC) to detect ATM header errors. Similarly the following well known generator polynomial:

$$g(x)=x^{32}+x^{26}+x^{23}+x^{22}+x^{16}+x^{12}+x^{11}+x^{10}+x^8+x^7+x^5+x^4+x^2+x+1 \quad (1)$$

is used to generate a 32-bit CRC when transmitting data in conformity with, for example, CCIT V.42 modem standard or IEEE 802 LAN standards. CRC computation is typically carried out in the data link layer of a network by either software, hardware or a combination of hardware and software. A logic hardware dedicated to computation of CRC often includes a number of shift registers and modulo 2 adders/subtractors (XORs).

FIG. 1 shows a prior art logic hardware 10 that is adapted to compute a CRC-5 using the generator polynomial $g(x)=x^5+x^4+x^2+1$. Logic hardware 10 includes five shift registers 12, 14, 16, 18, 20 and three 2-input XOR gates 22, 24, 26. With every transition of the clock, one bit of data is serially applied to input terminal IN1 of XOR gate 22, with the most significant bit of the data applied first. Furthermore, with every transition of the clock, each of the shift registers 12, 14, 16, 18, 20 shifts the data present at its respective D terminal to its respective output terminal Q (i.e., to. the left). The data present at output terminals Q of shift registers 12, 14, 16, 18, 20 form the 5 bits of the CRC-5.

A commonly known standard referred to as synchronous optical network (SONET) defines a synchronous frame structure for transmitting signals using time division multiplexed (TDM) technique. In accordance with the TDM technique, data bits associated with different channels are interleaved in the time domain to form a composite bit stream. For example, assume that each time slot is about 15 us for a single voice channel operating at 64 Kb/sec. Accordingly, five such channels may be multiplexed via the TDM technique if the bit streams of successive channels are delayed by 3 usec.

The basic building block of an exemplary SONET has a bit rate of 51.84 Mb/s which has a corresponding optical signal referred to as OC-1. Bits disposed in packets transported over the SONET channel (Packet over SONET), are carried over a bus having a width of, e.g. 16 bits. The 16-bit data are subsequently aggregated by an integrated circuit, such as a SONET framer, adapted to carry the data using a wider, e.g. 128-bit (i.e., 16-byte) bus. To generate a CRC-32 for a packet whose bytes are received over a 128-bit bus using conventional approach would require a relatively large number of shift registers and XOR gates. As the number of shift registers and XOR gates increases, it becomes more difficult to generate the CRC-32 within the time period set by the operating clock frequency.

There is a need for efficient implementation of logic hardware adapted to timely generate CRCs employing polynomials of higher degrees.

BRIEF SUMMARY OF THE INVENTION

A cyclic redundancy check (CRC) generator, in accordance with one embodiment the present invention, uses a two-stage division operation to generate a 32-bit CRC for each packet whose bytes are carried over a 128-bit bus. During the first stage of the division, the packet data bytes are divided by a first generator polynomial of $123^{rd}$ degree. During the second stage of the division, the remainder of the division performed during the first stage is divided by a second generator polynomial of $32^{nd}$ degree. The remainder of the division carried out during the second stage is the 32-bit CRC and is appended to the end of the packet before the packet is transmitted.

According to a specific embodiment of the present invention, a CRC generator includes first, second and third dividing logic. The first dividing logic is adapted to receive the data bytes that belong to a new packet and to divide these bytes by the first generator polynomial. The second dividing logic receives both the data bytes that belong to a current packet as well as the remainder of the division performed by the first dividing logic. The second dividing logic—which also divides the data it receives by the first generator polynomial—supplies the remainder of its division to the third generator polynomial. The first and second dividing logic together perform the first stage of the division. The third dividing logic receives the remainder of the division performed by the second dividing logic and divides this remainder by the second generator polynomial. Accordingly, the third dividing logic performs the second stage of the division. The remainder of the division performed by the third dividing logic is the generated CRC.

A decoder disposed in the CRC-generator determines which byte(s) of an incoming 128-bit data belong to a current packet and which byte(s) belong to a new packet. The decoder receives such information as the end position of a current packet, the start position of a new packet, and a four-bit control information representative of the count of each byte carried by the bus. The decoder, using the four-bit control information, decodes 15 pointer signal each pointing to a different one of the 15 most significant bytes of the data carried by the 128-bit bus.

The first dividing logic includes 16 dividers and 15 muxes. Each divider receives and divides a different one of the bytes of a new packet by the first generator polynomial. Each mux receives at its select terminal a different one of the pointer signals generated by the decoder. Each mux also receives an initial value at its first input terminal. The mux receiving the pointer signal pointing to the $i^{th}$ byte of the data of a new packet, receives the remainder of the division performed on the $(i+1)^{th}$ byte of that data at its second input terminal, and supplies its output signal to the divider adapted to divide the $i^{th}$ byte of the data. The first dividing logic supplies a 123-bit remainder to the second dividing logic.

The second dividing logic includes 16 dividers each adapted to divide a different one of the data bytes of a current packet by the first generator polynomial and generate a 123-bit remainder. The divider adapted to divide the $i^{th}$ byte of the data of a current packet supplies its remainder to the divider adapted to divide the $(i-1)^{th}$ byte of that data. A mux disposed in the second dividing logic supplies one of the sixteen 123-bit remainders to the third dividing logic which, in turn, generates the 32-bit CRC.

The following detailed descriptions and the accompanying drawings provide a better understanding of the nature and advantages of the CRC generator of the present invention.

DETAILED DESCRIPTION OF THE INVENTION

The invention herein is described in the context of a SONET communication system with specific characteristics for illustrative purposes only. It is to be understood that the CRC generating technique of the invention is applicable to a variety of communication systems where CRC generator using polynomials of higher degree are desirable.

Figure 1:
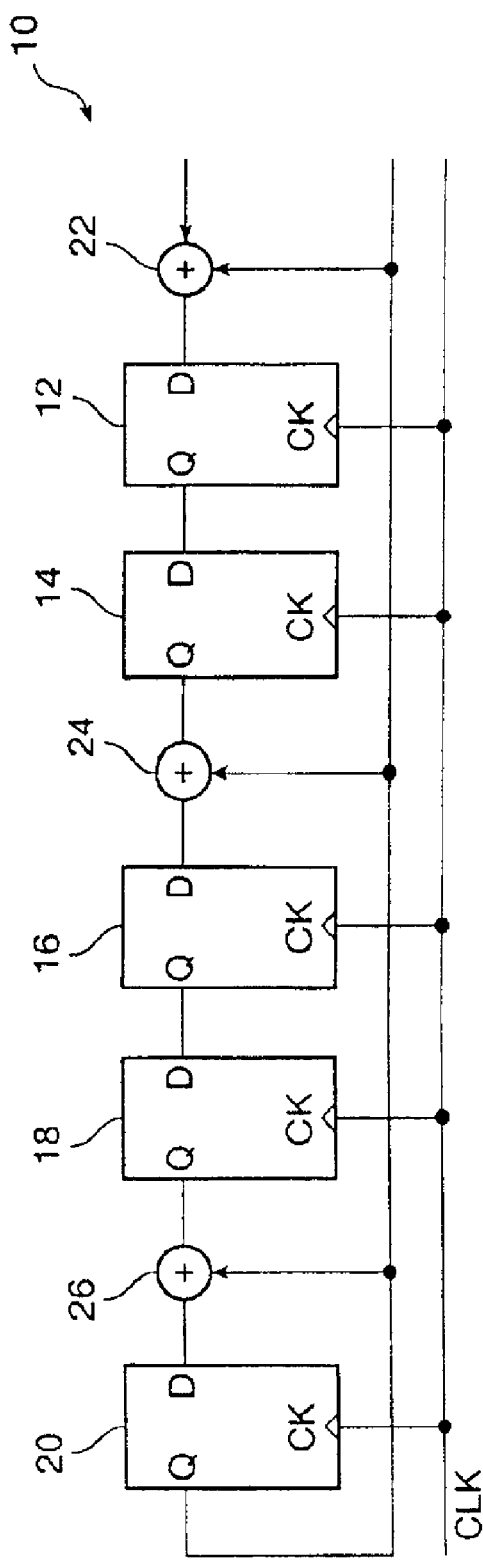
FIG. 1 is a simplified block diagram of logic hardware adapted to generate a 5-bit cyclic redundancy check, as known in the prior art.
Figure 2:
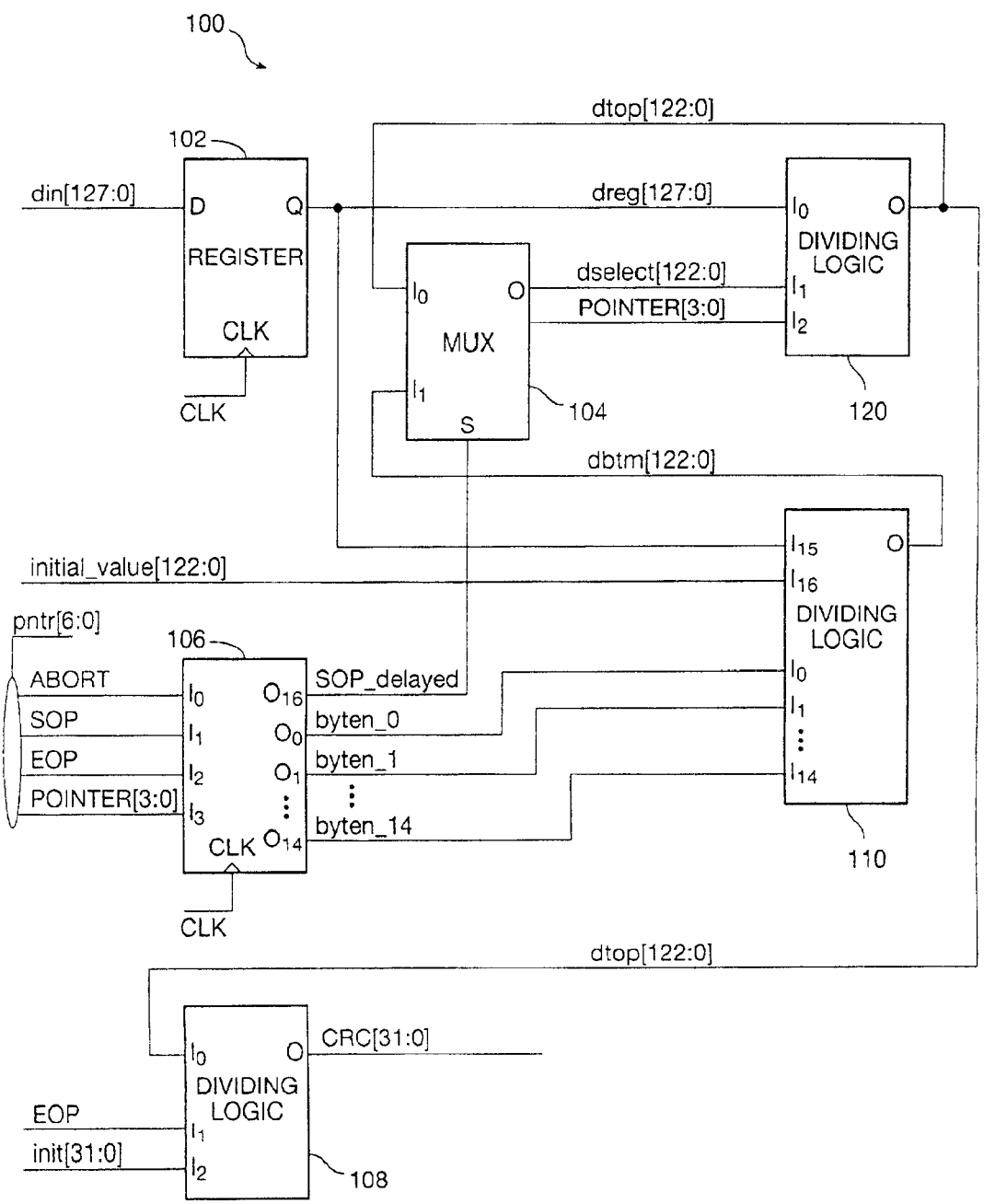
FIG. 2 is a simplified block diagram of logic hardware adapted to generate a 32-bit cyclic redundancy check for a packet whose data bytes are received over a 128-bit bus, in accordance with one embodiment of the present invention.

FIG. 2 is a simplified block diagram of logic hardware 100, in accordance with one exemplary embodiment of the present invention, that is adapted to generate a 32-bit cyclic redundancy check (hereinafter referred to as CRC-32) signal CRC[31:0] for each packet whose bytes are disposed in 128-bit signal din[127:0]. Logic hardware 100 (hereinafter referred to as CRC-32 generator 100) includes, in part, register 102, multiplexer (mux) 104, decoder 106, first dividing logic 110, second dividing logic 120, and third dividing logic 130.

With each rising or falling edge of the clock signal CLK, 128 bits of data din[127:0] (alternatively referred to hereinbelow as din) arrive at input terminal D of register 102. Similarly with each such rising or falling CLK edge, a 7-bit control signal pntr[6:0] (alternatively referred to hereinbelow as pntr) arrives at input terminal I of decoder 106. Bit 0, ABORT, of control signal pntr indicates an abrupt termination of an incoming packet. Bit 1, EOP, of control signal pntr points to the end of the packet whose other bytes were received earlier, i.e., the current packet. Bit 2, SOP, of control signal pntr points to the first byte of a new packet. Bits 3–7, POINTER, of pntr are used in conjunction with EOP signal to identify which bytes of data belong to a current packet and which bytes belong to a new packet, as described further below.

Figure 3:
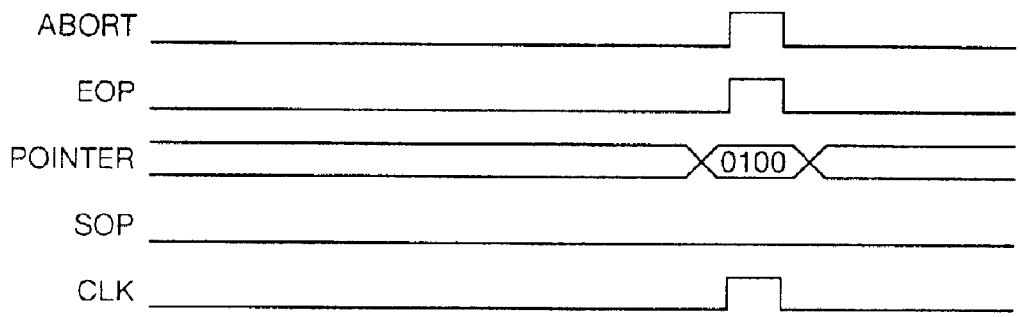
FIG. 3 is an exemplary waveform of various bits of a control signal received by the logic hardware of FIG. 1, in accordance with one embodiment of the present invention.

FIG. 3 is an exemplary waveform of the various bits of signal pntr arriving synchronously with respect to signal CLK. In accordance with FIG. 3, when signal CLK is asserted (i.e., makes a low-to-high transition), signal ABORT is also asserted and signal POINTER has a binary value of 4, pointing to the $5^{th}$ byte (i.e., byte count 4) of din (not shown). Therefore, bytes 0–4 of din are valid packet bytes, whereas bytes 5–15 of din are discarded (not shown). Signal EPO is also asserted to designate the packet end.

Figure 4:
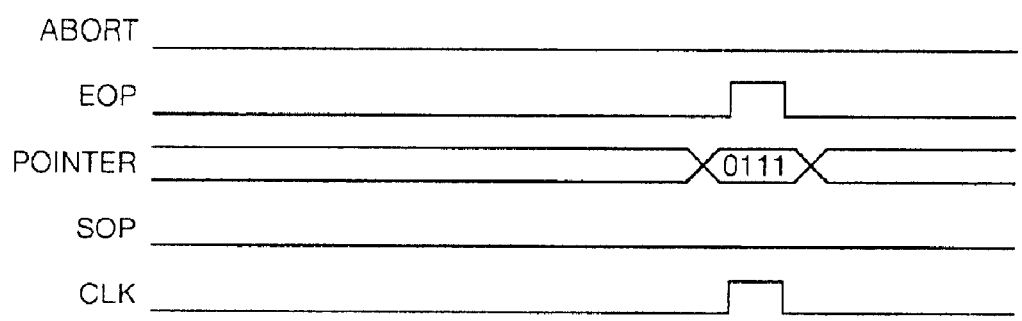
FIG. 4 is another exemplary waveform of the various bits of the control signal received by the logic hardware of FIG. 1, in accordance with one embodiment of the present invention.

FIG. 4 is another exemplary waveform of the various bits of signal pntr arriving synchronously with respect to signal CLK. In accordance with FIG. 4, when signal CLK is asserted, signal EOP is also asserted and signal POINTER has a binary value of 7, pointing to the $8^{th}$ byte of data din. Therefore, byte 7 of din is the end byte of the current packet.

Figure 5:
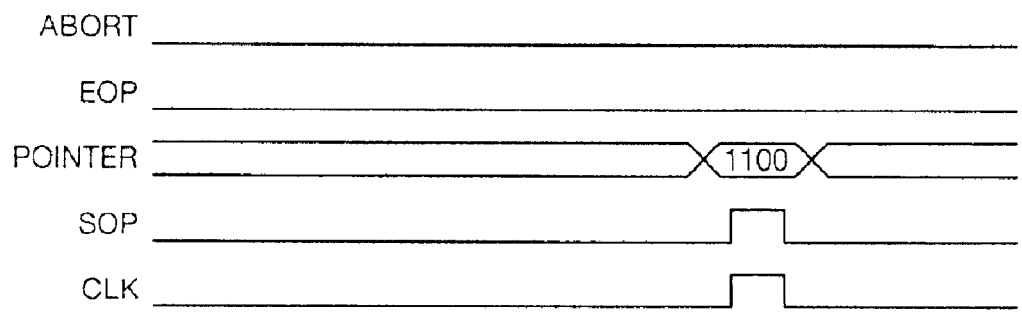
FIG. 5 is another exemplary waveform of the various bits of the control signal received by the logic hardware of FIG. 1, in accordance with one embodiment of the present invention.

FIG. 5 is another exemplary waveform of the various bits of signal pntr arriving synchronously with respect to signal CLK. In accordance with FIG. 5, when signal CLK is asserted, signal SOP is also asserted and signal POINTER has a binary value of 11, pointing to the $12^{th}$ byte of data din. Therefore, bytes 0–10 belong to a current packet and bytes 11–15 belong to a new packet.

Decoder 106 receives signal pntr and, in response, generates signal SOP delayed as well as 15 pointer signals, byten_0, byten_1, . . . , byten_14. Only three of these 15 pointer signals, namely byten_0, byten_1, and byten_14 are shown in FIG. 2. Signal SOP_delayed is replicated from signal SOP after only cycle of signal CLK. Each of these 15 pointer signals points to a different one of the 15 most significant bytes of data din. For example, signal byten_0 points to the $1^{st}$ byte of din, and byten_14 points to the $15^{th}$ byte of din. Accordingly, when, e.g., signal POINTER has a value of 0000, signal byten_0 is asserted and when signal POINTER has a value of 0100, signal byten_4 is asserted. The 15 pointer signals decoded by decoder 106 are applied to the input terminals of dividing logic 110. In the following, each of the 15 pointer signals is alternatively identified as byten_i, where i is an integer varying from 0 to 14.

As describe above, signal SOP-delayed is a delayed replica of signal SOP and is applied to the select terminal S of mux 104. Data signal din is applied to input terminal D of 128-bit register 102. Register 102, in turn, supplies 128-bit data signal dreg[127:0] at its output terminal Q. Data signal dreg[127:0] (hereinafter referred to as dreg) is delivered to both dividing logic 120 and dividing logic 110. Dividing logic 110, in turn, uses the 15 pointer signals byten_i to identify which, if any, of the dreg bytes dividing logic 110 must divide by the generator polynomial M(x):

$$M(x)=x^{123}+x^{111}+x^{92}+x^{84}+x^{64}+x^{46}+x^{23}+1 \quad (2)$$

If all the 16 bytes of dreg arc identified as belonging to a current packet, then dividing logic 120 receives and divides the 16 bytes of dreg by the generator polynomial M(x). Accordingly, dividing logic 110 does not perform any division for this data. If some of the 16 data bytes of dreg are identified as belonging to a current packet and some as belonging to a new packet, the bytes identified as belonging to the current packet are divided by dividing logic 120 and those identified as belonging to the new packet are divided by dividing logic 110. If all of the 16 data bytes of din are identified as belonging to a new packet, then dividing logic 110 receives and divides all of the 16 bytes of dreg by the generator polynomial M(x), accordingly, dividing logic 120 does not perform any such division.

Assume, for example, that bytes 0–10 of an incoming dreg belong to a current packet and bytes 11–15 belong to a new packet. Accordingly, signal SOP is asserted synchronously with signal CLK when signal POINTER has a value of 11. Although dividing logic 110 receives all the 16-bytes of dreg, dividing logic 110 is instructed by signal byten_10 to divide only bytes 11–15 of dreg by the polynomial generator M(x). The reminder of the division performed by each of dividing logic 120 and 110 includes 123 bits.

Dividing logic 110 supplies the 123-bit remainder—that it generates by dividing the bytes of dreg by the generator polynomial M(x)—via signal dbtm[122:0] (hereinafter referred to as dbtm). Similarly, dividing logic 120 supplies the 123-bit remainder—that it generates by dividing the bytes of dreg by the generator polynomial M(x)—via signal dtop[122:0] (hereinafter referred to as dtop). Signals dtop and dbtm are respectively applied to input terminals I0 and I1 of mux 104. Signal SOP-delayed supplied by decoder 106 is applied to the select input terminal S of mux 104. If signal SOP-delayed is at a low logic level, signal dtop is transferred to output terminal O of mux 104. If signal SOP-delayed is at a high logic level, signal dbtrn is transferred to output terminal O of mux 104. The 123-bit signal dselect[123] (hereinafter referred to as dselect) present at output terminal O of mux 104 is applied to input terminal I17 of divider 120.

A described above, dividing logic 120 and 110 may concurrently perform division operations on data bytes belonging to two different packets. Because dividing logic 110 operates on (i.e., divides) the first group of byte(s) of a new packet, it receives a 123-bit signal, designated in FIG. 2 as initial_value[122:0], in order to carry out its division operation. After dividing logic 110 completes its division operation and generates the 123-bit remainder signal rmbtm, as described further below, signal SOP-delayed transitions from a low logic level to a high logic level to enable signal rmbtm to be transferred to dividing logic 110 via signal dselect.

Dividing logic 120 uses signal dselect as the starting value to perform its division operation. So long as CRC-32 generator 100 receives bytes belonging to a current packet—which may continue for many clock cycles—signal dtop[123:0] (hereinafter referred to as dtop) is fed back to dividing logic 120 to be used in dividing the new bytes of the current packet by generator polynomial M(x). However, once signal SOP-delayed is asserted—indicating that dividing logic 110 has completed dividing the first group of bytes of a new packet—signal dbtm is supplied to dividing logic 120 to be used in dividing the new bytes of the current packet by generator polynomial M(x). Dividing logic 120 supplies the 123-bit remainder of the division operation that it performs via signal dtop to dividing logic 130.

Dividing logic 130 divides the 123-bit data dtop when signal EOP applied to its input terminal I1 is asserted. Dividing logic divides data dtop by the following generator polynomial g(x):

$$g(x)=x^{32}+x^{26}+x^{23}+x^{22}+x^{16}+x^{12}+x^{11}+x^{10}+x^8+x^7+x^5+x^4+x^2+x+1 \quad (3)$$

To perform this division, divider 130 receives—at its input terminal I2—a 32-bit starting value, designated in FIG. 2 as init[31:0] (hereinafter referred to alternatively as init). The 32-bit remainder of this division is the CRC[31:0] which is subsequently appended to the end of the current packet (not shown).

Figure 6:
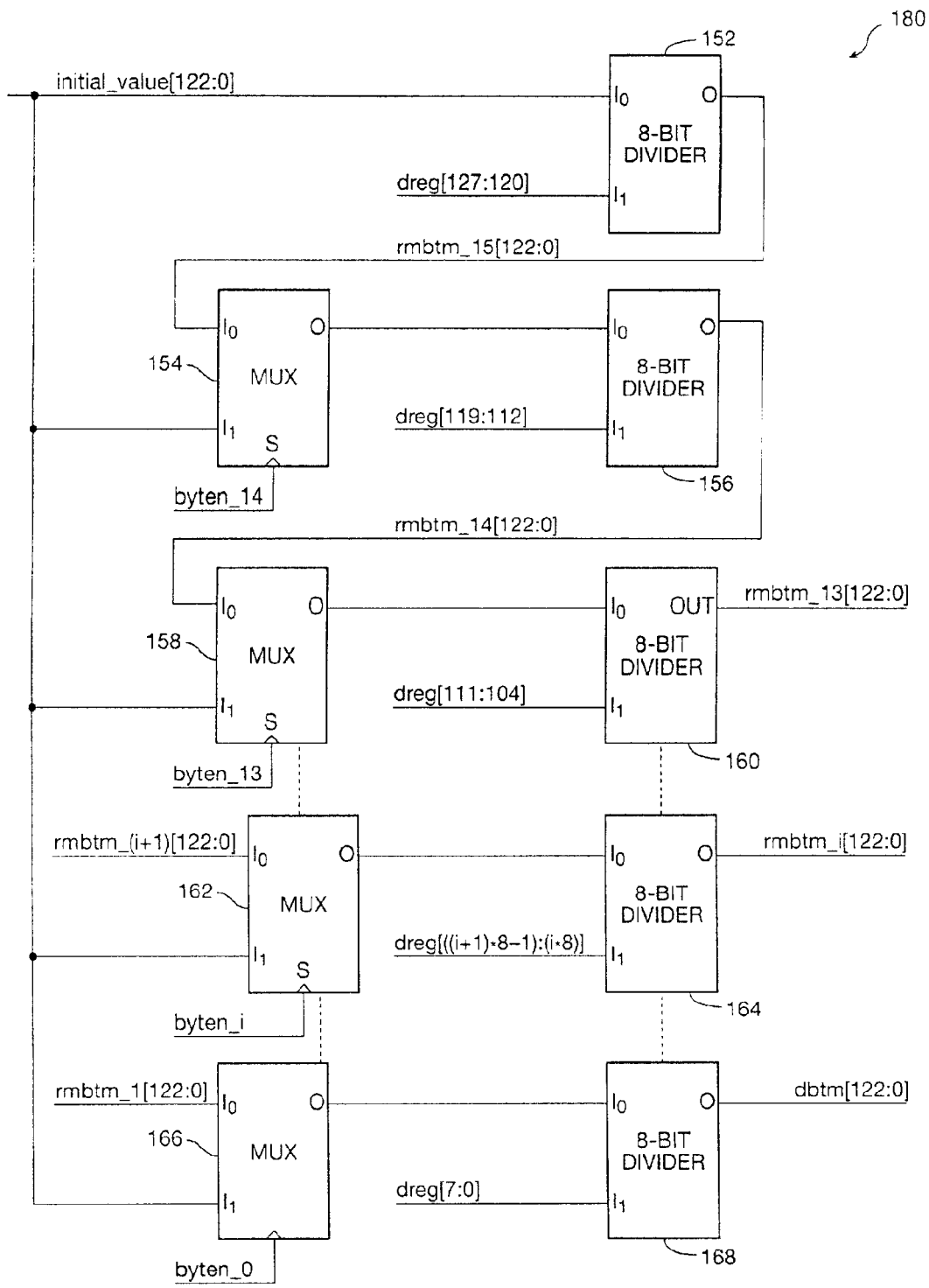
FIG. 6 is a simplified block diagram of a dividing logic disposed in the logic hardware of FIG. 2 and adapted to divide the data bytes of a new packet by a generator polynomial of 123rd degree, in accordance with one embodiment of the present invention.

FIG. 6 is a simplified block diagram of logic blocks disposed in dividing logic 110 (see FIG. 2). Dividing logic 110 includes sixteen 8-bit dividers and fifteen 123-bit muxes. Each of the 8-bit dividers receives and divides an 8-bit data with the generator polynomial M(x) of equation (2), shown above. FIG. 6 shows only five of the 8-bit dividers 152, 156, 160, 164, 168, and four of the 123-bit muxes, 154, 158, 162, 166.

Each 8-bit divider of dividing logic 110 receives a different one of the 16 bytes of dreg and divides that byte by the generator polynomial M(x) using a 123-bit value. The 123-bit starting value used by the 8-bit divider 152, which divides the $16^{th}$ byte of dreg[127:120] (i.e., byte count 15), is supplied by signal initial_value. Signal initial_value is also applied to input terminal I1 of each of the fifteen muxes disposed in divider 110. The result of the division performed by each 8-bit divider is supplied via an associated mux to the 8-bit divider operating on the byte having a lower count. For example, the remainder of the division performed by 8-bit divider 152, i.e., rmbtm_15[122:00], is supplied to 8-bit divider 156 via associated mux 154. Each of the muxes disposed in dividing logic 110 receives at its select terminal a different one of the pointer signals generated by decoder 106. For example, signal byten_14 is applied to the select terminal S of mux 154. Similarly, signal byten_13 is applied to the select terminal S of mux 158, and signal byten_0 is applied to the select terminal S of mux 166.

As seen in FIG. 6, each mux also receives a 123-bit signal at its input terminal I0 which is the remainder of the division performed by the 8-bit divider operating on a byte with a higher count. For example, mux 154 receives the remainder of the division performed by 8-bit divider 152. Similarly, mux 158 receives the remainder of the division performed by 8-bit divider 156; mux 166 receives the remainder of the division performed by 8-bit divider 164. In general, a mux, such as mux 162, which receives the remainder of the division performed on the $(i+1)^{th}$ byte of dreg at its input terminal I0, receives the pointer signal pointing to the $i^{th}$ byte of dreg at its select input terminal S, and supplies data to the divider adapted to divide the $i^{th}$ byte of dreg, where i is an integer varying from 0 to 14.

If the signal applied to the S terminal of a mux in dividing logic 110 is at a low logic level, that mux supplies the remainder of the division of the $i^{th}$ byte of dreg to the 8-bit divider adapted to divide the $(i-1)^{th}$ byte of dreg. If on the other hand, the signal applied to the S terminal of a mux in dividing logic 110 is at a low logic level, that mux supplies signal initial_value to its associated 8-bit divider signal.

The remainder of the division operation carried out by 8-bit divider 168 is the output signal dbtm[122:0] of dividing logic 110. As seen from FIG. 2, signal dbtm[122:0] is applied to input terminal I1 of mux 104. Mux 104 also receives signal dtop[122:0] (hereinafter referred to as dtop), generated by dividing logic 120, at its input terminal I1. After dividing logic 110 completes its division operation and generates signal dbtrn, signal SOP-delayed is asserted to pass signal dbtm to dividing logic 120 via signal dselect [127:120]. Thereafter, signal SOP-delayed is maintained at a low level to enable the remainder of the division performed by dividing logic 120 to be fed back to dividing logic 120

Figure 7:
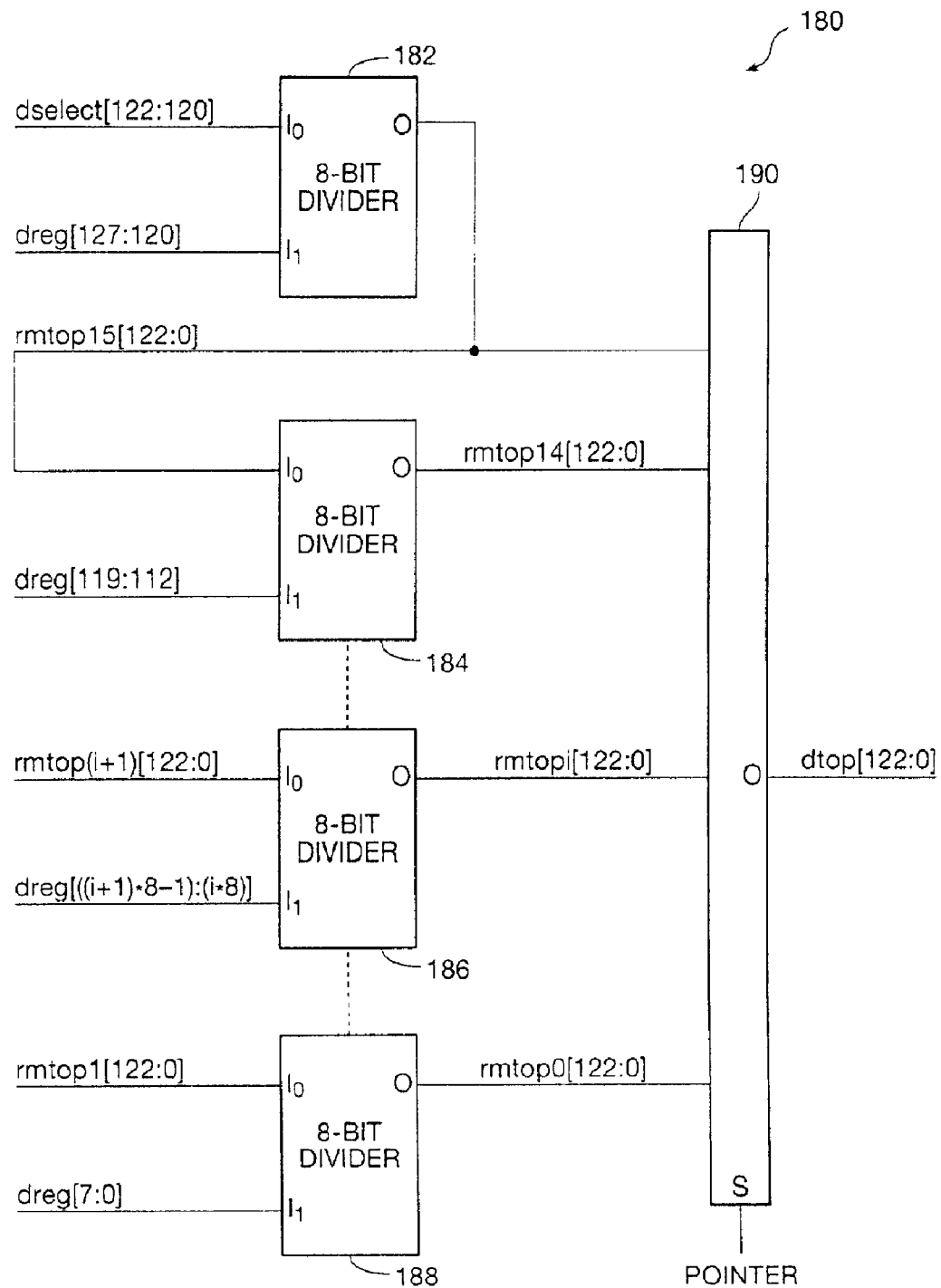
FIG. 7 is a simplified block diagram of a dividing logic disposed in the logic hardware of FIG. 2 and adapted to divide the data bytes of a current packet by the generator polynomial of 123rd degree, in accordance with one embodiment of the present invention.

FIG. 7 is a simplified block diagram of various logic blocks disposed in dividing logic 120 (see FIG. 2). Dividing logic 120 includes sixteen 8-bit dividers and a 16-to-1 mux. Each of the 8-bit dividers of dividing logic 120 receives and divides—by generator polynomial M(x)—a different one of the bytes of dreg. FIG. 7 shows 16-to-1 mux 190 and only four of such 8-bit dividers 182, 184, 186, 188.

8-bit divider 182 receives and divides data byte dreg [127:120] by the generator polynomial M(x) using signal dselect[127:120] as the starting value. The remainder of the division performed by 8-bit divider 182 is the 123-bit signal rmtop__15[122:00] which is supplied to input terminal I0 of divider 184. 8-bit divider 184 receives and divides data byte dreg[119:112] by the generator polynomial M(x) using rmtop__15[122:0] as the starting value. Therefore, the 8-bit divider adapted to divide the $i^{th}$ byte of dreg, uses as the starting value the remainder of the division performed on the $(i-1)^{th}$ byte of dreg. The 16 signals generated by the 16 dividers of dividing logic 120 are applied to input terminals I0–I15 of mux 190. The 4-bit select terminal of mux 190 receives signal POINTER. Depending on the value of signal POINTER one of the signals applied to mux 190 is transferred to its output terminal O. For example, if POINTER has a value of 0, signal rmtop0[122:0] is passed to output ternminal O of mux 190. Similarly, if POINTER has a value of 14, signal rmtop14[122:0] is passed to output terminal O of mux 190. In general, if signal pointer has a value i, signal rmtopi[122:0] is passed to output termminal O of mux 190, where is an integer between 0 and 15. The 123-bit signal dtop, supplied at output terminal O of mux 190 is the output signal of dividing logic 120. Signal dtop is applied to the input termianl I0 of mux 104 and to the input terminal I0 of dividing logic 130 which uses dtop[122:0] to genearte CRC[31:0], as described abve.

The 8-bit dividers disposed in each of dividers 120 and 110 include combinatorial and sequential logic gates that are so configured as to enable the division of their respective data by generator polynomial M(x). Standard logic design techniques may be used to select and interconnect such logic gates. Also, conventional logic design programming languages, such as VHDL or Verilog, in combination with logic design synthesis tools, such as those available from Synopsys corp. located at 700 East Middlefield road, Mountain View, Calif. 94043, may be used to design the 8-bit dividers and any of the other logic blocks disposed in CRC-32 generator 100, as is known to those skilled in the art.

It is to be understood that the above embodiments of the present invention are illustrative and are not intended to be limiting. Various alternatives and equivalents are possible. For example, the specific degree of polynomials, sizes of the various data buses, selection of specific bits of data as control bits are all exemplary in nature and may vary from implementation to implementation. That is, for example, the inventive concept can apply to CRC generators using polynomials of different degrees, or communication systems other than SONET. Furthermore, the hardware described in the specific embodiment of the inventions, e.g., dividers, mux decoders and registers, is not limited to any specific type or implementation. Nor is the invention limited to any specific type of process technology, e.g., CMOS, Bipolar, BICMOS; any process technology may be used to from the CRC generator.

The invention is not limited by the type of integrated circuit in which the CRC generator is disposed. For example, the CRC generator, in accordance with the present invention, may be disposed in an integrated circuit framer, a programmable logic device, or any other integrated circuit which is adapted to transmit or receive data across a network communication channel. Other additions, subtractions or modification are obvious in view of the invention and are intended to fall within the scope of the appended claims.

What is claimed is:

1. An integrated circuit adapted to receive data bits of a packet via a N-bit bus and generate a cyclic redundancy check for the packet, the integrated circuit comprising:

a first dividing logic comprising M dividers each adapted to receive and divide a different one of the N/M bits of the data by a first generator polynomial, wherein the divider receiving the first of the N/M bits of data supplies a first output signal;

a second dividing logic adapted to receive the first output signal, said second dividing logic comprising P dividers each adapted to receive and divide a different one of the N/P bits of the data it receives by the first generator polynomial to generate a remainder, said second dividing logic further adapted to supply one of the N/P remainders as a second output signal; and a third dividing logic adapted to receive and divide the second output signal by a second generator polynomial.

2. The integrated circuit of claim 1 wherein each of the N/M bits of the data received by the first dividing logic belongs to a new packet and wherein each of the N/P bits of the data received by the second dividing logic belongs to a current packet.

3. The integrated circuit of claim 1 wherein said second dividing logic further comprise a multiplexer adapted to receive each of the N/P remainders at its input terminals and supply the second output signal at its output terminal.

4. The integrated circuit of claim 1 wherein said first generator polynomial is of $123_{rd}$ degree.

5. The integrated circuit of claim 4 wherein said 123$^{rd}$ generator polynomial is defined by:

$$x^{123}+x^{111}+x^{92}+x^{84}+x^{64}+x^{46}+x^{23}1.$$

6. The integrated circuit of claim 1 wherein said second generator polynomial is of 32$^{nd}$ degree.

7. The integrated circuit of claim 6 wherein said second generator polynomial is defined by:

$$x^{32}+x^{26}+x^{23}+x^{22}+x^{16}+x^{12}+x^{11}+x^{10}+x^8+x^7+x^5+x^4+x^2+x+1.$$

8. The integrated circuit of claim 1 wherein N is 128.

9. The integrated circuit of claim 8 wherein each of M and P is 8.

10. A method for generating a cyclic redundancy check for a packet whose data are carried over a N-bit bus, the method comprising:
   dividing each N/M bits of the data by a first generator polynomial;
   dividing each N/P bits of the data by the first generator polynomial to generate N/P remainders;
   selecting one of the N/P remainders as an output signal; and
   dividing the output signal by a second generator polynomial.

11. The method of claim 10 wherein each of the N/M bits of the data belongs to a new packet and wherein each of the N/P bits of the data belongs to a current packet.

12. The method of claim 10 wherein said first generator polynomial is of 123$^{rd}$ degree.

13. The method of claim 12 wherein said 123$^{rd}$ generator polynomial is defined by:

$$x^{123}+x^{111}+x^{92}+x^{84}+x^{64}+x^{46}+x^{23}+1.$$

14. The method of claim 10 wherein said second generator polynomial is of 32$^{nd}$ degree.

15. The method of claim 14 wherein said second generator polynomial is defined by:

$$g(x)=x^{32}+x^{26}+x^{23}+x^{22}+x^{16}+x^{12}+x^{11}+x^{10}+x^8+x^7+x^5+x^4+x^2+x1.$$

16. The method of claim 10 wherein N is 128.

17. The method of claim 16 wherein each of M and P is 8.

18. An integrated circuit adapted to receive data bytes of a packet via a 16-byte wide bus and generate a 32-bit cyclic redundancy check for the packet, each byte including 8 bits, the integrated circuit comprising:
   a decoder adapted to receive a control signal and generate 15 pointer signals each associated with a different one of the 15 most significant bytes of the data;
   a first dividing logic comprising:
      sixteen dividers each adapted to receive a different one of the sixteen bytes of the data and divide the received data by a first generator polynomial of 123$^{rd}$ degree; wherein the divider receiving the 16$^{th}$ byte of data receives a start signal and wherein the divider receiving the 1$^{st}$ byte of the data supplies a first output signal; and
      fifteen multiplexers each receiving the start signal at its first input terminal and each receiving at its select terminal a different one of the 15 pointer signals, wherein the multiplexer receiving the pointer signal associated with the i$^{th}$ byte of the data receives the remainder of the division performed on (i+1)$^{th}$ byte of the data at its second input terminal and supplies a signal to the divider adapted to divided the i$^{th}$ byte of the data;
   a second dividing logic comprising:
      sixteen dividers each adapted to receive a different one of the sixteen bytes of the data and divide the received data by the first generator polynomial to generate a remainder; wherein the divider adapted to divide the i$^{th}$ byte of the data receives the remainder of the division performed on the (i+1)$^{th}$ byte of the data; and
      a multiplexer receiving the remainder generated by each of the sixteen dividers in the second dividing logic at its input terminals and receiving the control signal at its select terminal, wherein said multiplexer supplies a second output signal;
   a second multiplexer adapted to supply one of the first and second output signals to that divider in the second dividing logic which is adapted to divide (i+1)$^{th}$ byte of the data; said second multiplexer adapted to receive at it select terminal a signal that is a delayed replica of a start-of-packet signal; and
   a third dividing logic adapted to receive and divide the second output signal by a second generator polynomial of 32$^{nd}$ degree.

19. The integrated circuit of claim 18 wherein said first generator polynomial is:

$$x^{123}+x^{111}+x^{92}+x^{84}+x^{64}+x^{46}+x^{23}+1.$$

20. The integrated circuit of claim 18 wherein said second generator polynomial is:

$$x^{32}+x^{26}+x^{23}+x^{22}+x^{16}+x^{12}+x^{11}+x^{10}+x^8+x^7+x^5+x^4+x^2+x1.$$

21. The integrated circuit of claim 18 wherein the signal received by the select terminal of the second multiplexer is generated one clock cycle after the start-of-packet signal arrives.

22. The integrated circuit of claim 18, wherein said decoder is further adapted to receive an abort signal, an end-of-packet signal and the start-of-packet signal.

23. The integrated circuit of claim 18 wherein if the decoder receives the start-of-packet signal, data bytes belonging to a current packet are divided by the second dividing logic and the data bytes belonging to a new packet are divided by the first dividing logic.

24. The integrated circuit of claim 18 further comprising:
   a register adapted to receive and supply the 16 bytes of the data to the first and second diving logic.

25. The integrated circuit of claim 24 wherein said third dividing logic is further adapted to receive an end-of-packet signal and a 32-bit initial value.

* * * * *

UNITED STATES PATENT AND TRADEMARK OFFICE
CERTIFICATE OF CORRECTION

PATENT NO. : 6,968,492 B1
APPLICATION NO. : 10/113469
DATED : November 22, 2005
INVENTOR(S) : Annadurai et al.

It is certified that error appears in the above-identified patent and that said Letters Patent is hereby corrected as shown below:

On the Title Page, Item (57) Abstract, line 5, please change "123nd" to --123rd--.

line 12, please change "123nd" to --123rd--.

In column 1 at line 9, please change "networks" to --network--.

In column 1 at line 14, please insert --a-- after "carry".

In column 2 at line 28, please change "us" to --µs--.

In column 2 at line 31, please change "usec" to --µsec--.

In column 2 at line 41, please insert --a-- after "using".

In column 2, at lline 56, please change "123nd" to --123rd--.

In column 4 at line 18, please change "generator" to --generators--.

In column 5 at line 17, please change "describe" to --described--.

In column 5 at line 64, please change "dbtrn" to --dbtm--.

In column 7 at line 27, please change "dbtrn" to --dbtm--.

In column 7 at line 64, please change "genearte" to --generate--.

In column 7 at line 65, please change "abve" to --above--.

Column 8 at line 67, please replace "$123_{rd}$" to --$123^{rd}$--.

Column 9 at line 3, in the polynomial, please replace the portion "$+x^{23}1$" with --$+x^{23}+1$--.

UNITED STATES PATENT AND TRADEMARK OFFICE
CERTIFICATE OF CORRECTION

PATENT NO. : 6,968,492 B1
APPLICATION NO. : 10/113469
DATED : November 22, 2005
INVENTOR(S) : Annadurai et al.

It is certified that error appears in the above-identified patent and that said Letters Patent is hereby corrected as shown below:

Column 9 at line ~41, in the polynomial, please replace the portion "$+x^2 +x1$" with --$+x^2 + x + 1$--.

Column 10 at line 40, in the polynomial, please replace the last portion "$x1$" with --$x + 1$--.

Signed and Sealed this

First Day of August, 2006

JON W. DUDAS
*Director of the United States Patent and Trademark Office*